United States Patent
Gale et al.

(10) Patent No.: US 10,220,707 B2
(45) Date of Patent: Mar. 5, 2019

(54) BUS LEAKAGE RESISTANCE ESTIMATION FOR ELECTRIC VEHICLE

(71) Applicant: Ford Global Technologies, LLC, Dearborn, MI (US)

(72) Inventors: Allan R. Gale, Livonia, MI (US); Benjamin A. Tabatowski-Bush, South Lyon, MI (US); Richard W. Kautz, Rochester, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 152 days.

(21) Appl. No.: 15/401,714

(22) Filed: Jan. 9, 2017

(65) Prior Publication Data
US 2017/0113553 A1    Apr. 27, 2017

Related U.S. Application Data

(62) Division of application No. 14/607,404, filed on Jan. 28, 2015, now Pat. No. 9,579,977.

(51) Int. Cl.
*B60L 3/00* (2006.01)
*G01R 31/00* (2006.01)
(Continued)

(52) U.S. Cl.
CPC .............. *B60L 3/0069* (2013.01); *B60L 3/04* (2013.01); *B60L 3/12* (2013.01); *G01R 27/025* (2013.01);
(Continued)

(58) Field of Classification Search
CPC .. B60L 3/0069; B60L 3/12; B60L 3/04; B60L 2260/44; G01R 31/025; G01R 27/025; G01R 31/007
(Continued)

(56) References Cited

U.S. PATENT DOCUMENTS 7,626,396 B2   12/2009   Lindsey et al.
7,714,587 B2    5/2010   Lindsey et al.
(Continued)

FOREIGN PATENT DOCUMENTS

JP    2013214475    10/2013
WO   2010029353 A1   3/2010

OTHER PUBLICATIONS

Aravind Mathsyaraja, Ground Fault Detection for Flexible High Voltage Power Systems, A Thesis, Michigan State University, Master of Science, Electrical Engineering, 2010.

*Primary Examiner* — Brian P Sweeney
(74) *Attorney, Agent, or Firm* — David B. Kelley; MacMillan, Sobanski & Todd, LLC

(57) ABSTRACT

Electrical bus isolation is detected for an electrified vehicle having a DC power source connected to positive and negative buses. The positive bus is connected to chassis ground, and a resulting first current is sensed that flows through a negative bus leakage resistance and a balanced leakage resistance. The negative bus is connected to chassis ground, and a resulting second current is sensed that flows through a negative bus leakage resistance and a balanced leakage resistance. The positive and negative bus leakage resistances are estimated in response to respective ratios of the first and second currents. An isolation value is compared to a threshold, wherein the isolation value is responsive to a voltage of the DC power source and a smaller one of the positive and negative bus leakage resistances. An atypical isolation is signaled when the isolation value is less than the threshold.

4 Claims, 4 Drawing Sheets

(51) Int. Cl.
    *G01R 31/02*     (2006.01)
    *G01R 27/02*     (2006.01)
    *B60L 3/04*     (2006.01)
    *B60L 3/12*     (2006.01)

(52) U.S. Cl.
    CPC ......... *G01R 31/007* (2013.01); *G01R 31/025* (2013.01); *B60L 2260/44* (2013.01)

(58) Field of Classification Search
    USPC ...................................................... 701/33.9
    See application file for complete search history.

(56) References Cited

U.S. PATENT DOCUMENTS

| | | |
|---|---|---|
| 8,207,741 B2 | 6/2012 | Kang et al. |
| 8,222,907 B2 | 7/2012 | Streit |
| 8,624,611 B2 | 1/2014 | Aström |
| 2002/0121902 A1 | 9/2002 | Suzuki |
| 2008/0158756 A1 | 7/2008 | Lindsey et al. |
| 2011/0049977 A1 | 3/2011 | Onnerud et al. |
| 2013/0151175 A1 | 6/2013 | Streit |
| 2013/0245869 A1 | 9/2013 | Nishida et al. |

BUS LEAKAGE RESISTANCE ESTIMATION FOR ELECTRIC VEHICLE

CROSS REFERENCE TO RELATED APPLICATIONS

This application is a division of co-pending U.S. application Ser. No. 14/607,404, filed Jan. 28, 2015, granted as U.S. Pat. No. 9,579,977 on Feb. 28, 2017, which is hereby incorporated by reference.

STATEMENT REGARDING FEDERALLY SPONSORED RESEARCH

Not Applicable.

BACKGROUND OF THE INVENTION

The present invention relates in general to electrified vehicles using a high voltage bus, and, more specifically, to accurate estimation of the effective isolation resistance present between each high-power bus and a chassis ground.

Electrified vehicles such as for electric vehicles and hybrid electric vehicles typically utilize a high voltage power bus driven by a DC power source which may include storage and/or conversion devices such as a multi-cell battery pack or a fuel cell. The presence of high-voltage buses creates a need for monitoring of the electrical isolation of each bus with respect to the electrically conductive components of the vehicle chassis (ground).

Any leakage resistance present between a DC bus and chassis ground must be sufficiently large. In typical leakage resistance detection systems, there is an assumption that leakage resistance will be between one of the positive or negative DC buses and chassis ground. A typical leakage detector circuit operates by periodically connecting one bus at a time to chassis ground through a current-limiting resistance, and using the resulting current flow to calculate the leakage resistance between the opposite bus and ground. The calculated leakage resistance divided by battery voltage characterizes the electrical isolation.

Leakage resistance detection systems typically supply a current from one bus through a known resistance to the leakage resistance between the ground and the other bus. Such systems might miss a potential balanced component of leakage resistance from both buses to ground that can sometimes result in the mischaracterization of the electrical isolation because of a potential discrepancy in the derived leakage resistance values. More specifically, a resistance may exist between one bus and chassis ground as well as a resistance having a component of equal value between the other bus and chassis ground. These resistances, both being equal in value, are hereafter referred to as symmetrical or balanced leakage resistance. A resistance on one bus to chassis without a matching value on the other bus to chassis is hereafter referred to as non-symmetrical or unbalanced leakage resistance. The additional current flow through the balanced leakage resistance may cause prior art detection systems to overestimate the composite balanced and unbalanced resistance which exists between one bus and chassis ground. Estimating this latter composite resistance is desirable in order to more accurately determine the electrical isolation.

Co-pending application U.S. Ser. No. 14/504,588, entitled "Bus Leakage Resistance Estimation for Electrical Isolation Testing and Diagnostics," filed Oct. 2, 2014, granted as U.S. Pat. No. 9,758,044 on Sep. 12, 2017, which is incorporated herein by reference in its entirety, discloses methods and apparatus for identifying the balanced and unbalanced leakage resistances. Leakage currents are measured for the positive and negative buses. A correction factor based on a ratio of the currents is obtained in order to separate the balanced and unbalanced leakage resistance components.

The foregoing leakage resistance estimations depend on both voltage and current measurements from each of the detection circuits for the two respective buses. It would be desirable to reduce the number of measurements required and to reduce the computations needed to derive the unbalanced and/or balanced bus leakage resistances.

SUMMARY OF THE INVENTION

In one aspect of the invention, an electrified vehicle comprises a positive bus connectable to a positive output of a DC power source and a negative bus connectable to a negative output of the DC power source. A chassis ground is distributed within the vehicle. A first detector circuit has a first sampling switch selectably coupling a first fixed resistance between a first one of the buses and chassis ground. The first detector circuit detects first and second voltages between the chassis ground and a selected one of the buses with the first sampling switch open and closed, respectively. A control circuit identifies a bus leakage resistance in response to the first and second voltages and a source voltage between the positive and negative outputs of the DC power source. A Thévenin equivalent circuit may be used to identify a relationship between these voltages and the bus leakage resistances.

DETAILED DESCRIPTION OF PREFERRED EMBODIMENTS

The term "electrified vehicle" as used herein includes vehicles having an electric motor for vehicle propulsion, such as battery electric vehicles (BEV), hybrid electric vehicles (HEV), and plug-in hybrid electric vehicles (PHEV). A BEV includes an electric motor, wherein the energy source for the motor is a battery that is re-chargeable from an external electric grid. In a BEV, the battery or other DC source supplies energy for vehicle propulsion. A HEV includes an internal combustion engine and an electric motor, wherein the energy source for the engine is fuel and the energy source for the motor is a DC storage unit such as a battery. In a HEV, the engine is the main source of energy for vehicle propulsion with the battery providing supplemental energy for vehicle propulsion (e.g., the battery buffers fuel energy and recovers kinematic energy in electric form). A PHEV is like a HEV, but the PHEV may have a larger capacity battery that is rechargeable from the external electric grid. In a PHEV, the battery may be the main source of energy for vehicle propulsion until the battery depletes to a low energy level, at which time the PHEV operates like a HEV for vehicle propulsion.

Figure 1:
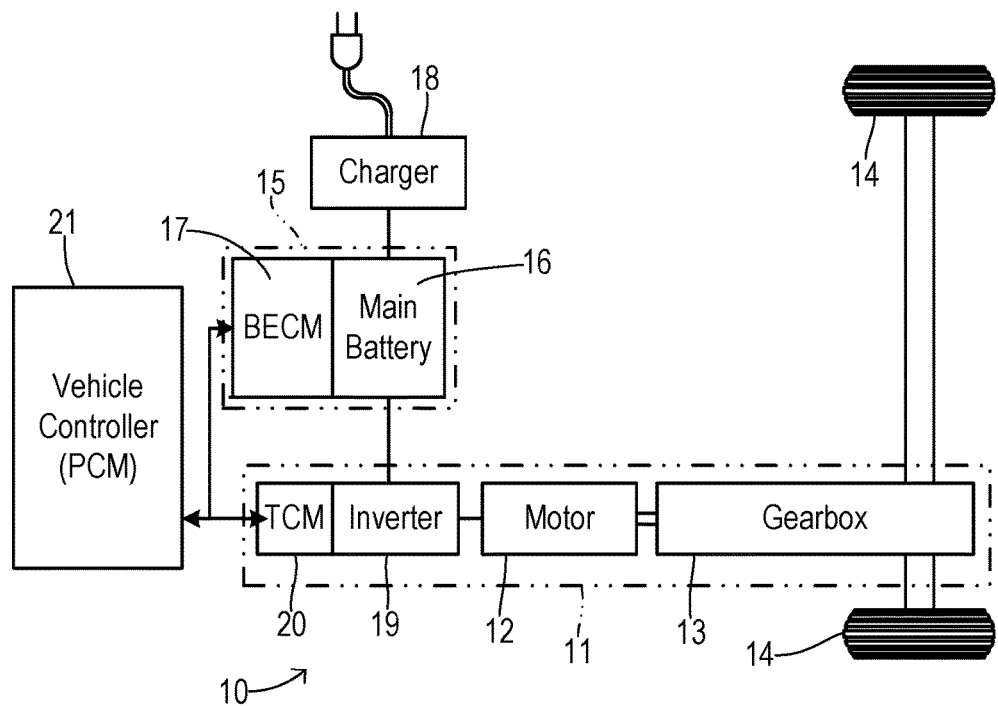
FIG. 1 is a block diagram showing one type of electrified vehicle to which the present invention is applied.

By way of example, FIG. 1 depicts a vehicle 10 as a battery electric vehicle (BEV) propelled by an electric motor 12 in a powertrain 11 without assistance from an internal combustion engine. Motor 12 receives electrical power and provides drive torque for vehicle propulsion. Motor 12 also functions as a generator for converting mechanical power into electrical power through regenerative braking. Powertrain 11 includes a gearbox 13 which couples motor 12 to driven wheels 14. Gearbox 13 adjusts the drive torque and speed of motor 12 by a predetermined gear ratio.

Vehicle 10 includes a battery system 15 including a main battery pack 16 and a battery energy controller module (BECM) 17. Battery pack 16 can be charged via a charger 18. An output of battery pack 16 is connected to an inverter 19 which converts the direct current (DC) power supplied by battery 16 to alternating current (AC) power for operating motor 12 in accordance with commands from a traction control module (TCM) 20. TCM 20 monitors, among other things, the position, speed, and power consumption of motor 12 and provides output signals corresponding to this information to other vehicle systems including a main vehicle controller 21 (which may be a powertrain control module, or PCM, for example).

Figure 2:
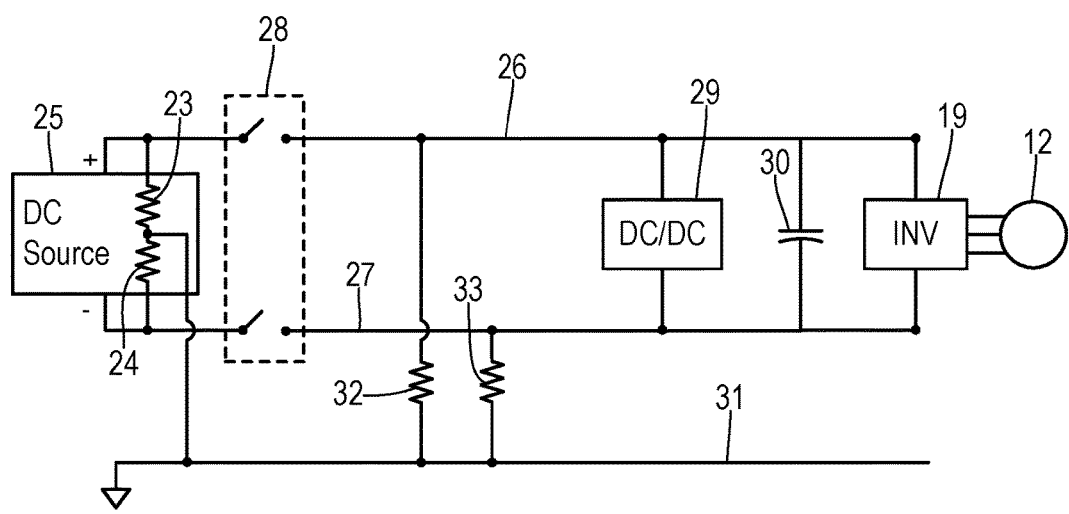
FIG. 2 is a schematic diagram showing one typical bus structure with leakage resistances shown.

FIG. 2 shows a typical bus architecture wherein a DC power source 25 (such as a fuel cell or battery pack) is selectively coupled to a positive bus 26 and a negative bus 27 via contactor switches 28. Buses 26 and 27 may be further coupled to a DC-to-DC converter 29, a link capacitor 30, and inverter 19 which drives traction motor 12. A chassis ground 31 represents conductive parts of the vehicle whose electrical potential is taken as a reference and which are conductively linked together.

Electrical isolation of buses 26 and 27 is determined by the electrical leakage resistance between each bus and chassis 31. A leakage resistance 32 represents the level of isolation between positive bus 26 and chassis 31. Leakage resistance 33 represents the isolation between negative bus 27 and chassis 31. Leakage resistances 32 and 33 may have both unbalanced and balanced (symmetrical) leakage resistances. In addition, leakage resistances 23 and 24 having unbalanced and balanced leakage resistance components may be present between buses 26 and 27 (assuming contacts 28 of FIG. 2 are closed), with the junction between leakage resistances 34 and 35 being connected to chassis 31. The balanced component of the leakage resistances may be caused within DC source 25 as shown, or may result from other conditions such as a breakdown of insulation.

Figure 3:
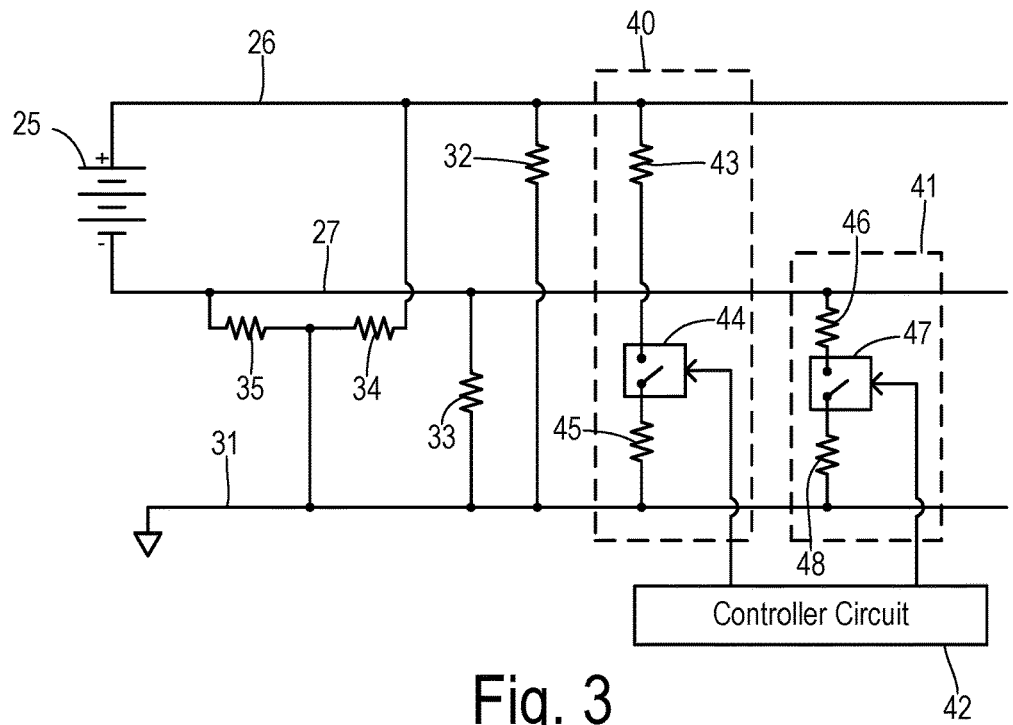
FIG. 3 is a schematic diagram showing test measurement circuits for characterizing bus leakage resistance.

FIG. 3 shows the addition of apparatus for detecting leakage resistance wherein resistances 34 and 35 represent the balanced resistance components of actual leakage resistances 32 and 33. When resistances 34 and 35 are shown, only one of resistances 32 and 33 has a value less than infinity. A first detector circuit 40 is arranged between positive bus 26 and chassis ground 31 and a second detector circuit 41 is arranged between negative bus 27 and chassis ground 31. First detector circuit 40 includes a current-limiting resistor 43 (denoted $R_d$) in series with a sampling switch 44 and another resistor 45 (denoted $R_s$). Separate resistors 43 and 45 are shown because this circuit topology is already in widespread production use. However, a single resistance in series with sampling switch 44 is all that is necessary (i.e., a combined resistance $R_c$). Resistors 43 and 45 together provide a first fixed resistance ($R_c=R_d+R_s$) as used in the computations shown below. A typical value for the fixed resistance may be about 419 k-ohms.

Switch 44 is a high or upper switch since it couples the upper or positive bus 26 to chassis ground 31. A controller circuit 42 is connected to switch 44 for selectively activating switch 44 so that a resulting current flows through detector circuit 40 that is dependent on bus leakage resistance 33 (i.e., when resistances 32, 34, and 35 do not exist). Likewise, second detector circuit 41 includes a series connection of a load resistor 46 ($R_d$), a lower sampling switch 47, and resistor 48 ($R_s$), with low switch 47 being controlled by controller circuit 42 for detecting resistance 32 when resistances 33, 34, and 35 do not exist. Controller circuit 42 may include a microcontroller such as in a battery energy controller module, for example.

Figure 4:
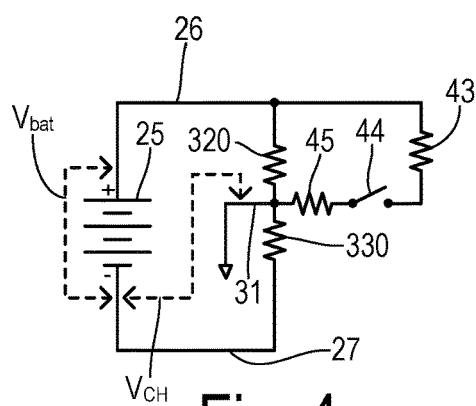
FIG. 4 is a schematic diagram showing the active elements with an upper sampling switch closed during a measurement related to the leakage resistance at the negative bus.
Figure 5:
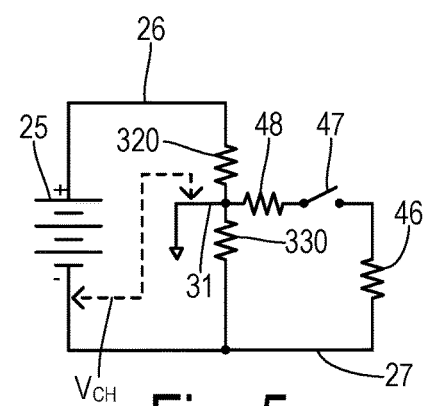
FIG. 5 is a schematic diagram showing the active elements with a lower sampling switch closed during a measurement related to the leakage resistance at the positive bus.

FIG. 4 shows the circuit elements that when switch 44 is closed effectively connect positive bus 26 to chassis ground 31 via resistances 43 and 45 in order to characterize the bus leakage parallel combination resistance 32/34 (shown as resistance 320) and parallel combination resistance 33/35 (shown as resistance 330) which are also denoted as $R_p$ and $R_n$, respectively. In the prior art, current and voltage measurements collected with sampling switch 44 in the closed position were used. As described in more detail below, the present invention collects a pair of voltage measurements $V_{CH}$ between chassis ground 31 and DC source 25 with switch 44 opened and closed, respectively, to characterize the leakage resistances without requiring a current measurement. Similarly, FIG. 5 shows the active circuit elements when effectively shorting negative bus 27 to chassis ground 31 in order to characterize leakage resistances $R_p$ and/or $R_n$. While the invention is illustrated using measurements from the negative bus $V_{bat-}$ to chassis ground, one skilled in the art will appreciate that they could alternatively be from the positive bus $V_{bat+}$ to chassis ground.

Figure 6:
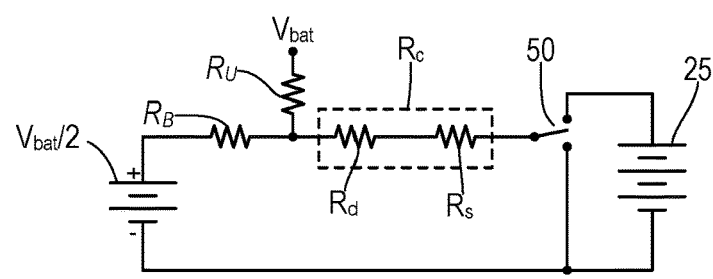
FIG. 6 is a schematic diagram showing one equivalent circuit corresponding to the test measurement circuits and leakage resistances.

By assuming that the fixed resistance in each of the detector circuits is the same and rearranging the balanced and unbalanced leakage resistances, an equivalent circuit is derived as shown in FIG. 6. Battery 25 is connected to a three-position switch 50 so that the fixed resistance $R_c$ can be connected to the positive DC voltage, connected to an open circuit, or connected to the negative DC voltage. Fixed resistance $R_c$ is coupled to positive DC voltage $V_{bat}$ through the unbalanced leakage resistance $R_U$ (alternatively, $R_U$ could instead be connected to the chassis ground in the present analysis). Fixed resistance $R_c$ is further coupled to the midpoint between the positive and negative DC voltage (i.e., $V_{bat}/2$) through the balanced leakage resistance $R_B$.

Figure 7:
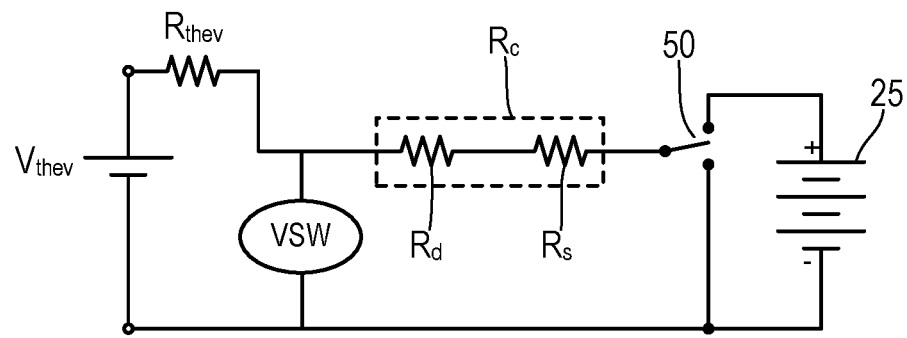
FIG. 7 is a Thévenin equivalent circuit based on the circuit of FIG. 6.

The voltage that is available between resistance $R_c$ and battery bus voltage $V_{bat-}$ when switch 50 is open can be resolved as a Thévenin voltage $V_{thev}$ in the Thévenin equivalent circuit of FIG. 7, wherein the Thévenin resistance $R_{thev}$ is the parallel combination of unbalanced leakage resistance $R_U$ and balanced leakage resistance $R_B$. When switch 50 is in the open position (i.e., both the upper and lower switches are open), no current will flow. Therefore, the voltage at the fixed resistance (denoted herein as a first chassis voltage $V_{CH1}$) equals the Thévenin voltage $V_{thev}$. Furthermore, using FIG. 4 or 5, the Thévenin voltage $V_{thev}$ also satisfies the formula:

$$V_{thev} = V_{bat} \cdot R_n / (R_n + R_p) \quad (1)$$

Where $R_n$ is resistance 330 and $R_p$ is resistance 320. When a sampling switch is closed, a second chassis voltage denoted $V_{CH2}$ is detected. When the upper (i.e., high) switch is closed, the chassis voltage will be denoted $V_{CH2-HIGH}$, and when the lower switch is closed, the chassis voltage will be denoted $V_{CH2-LOW}$.

In the Thévenin equivalent circuit of FIG. 7, the Thévenin resistance $R_{thev}$ is the parallel combination of unbalanced leakage resistance $R_U$ and balanced leakage resistance $R_B$, which can be expressed as follows:

$$R_{thev} = \frac{R_P \cdot R_N}{(R_P + R_N)} \quad \text{(Equation 2)}$$

VSW is the voltage measured when one of the switches is closed. For the case when the lower sampling switch (47 in FIG. 5) is closed, the Thévenin voltage becomes:

$$V_{thev} = (R_{thev} + R_C) \cdot i_{RC} \quad (3)$$

where $i_{RC}$ is the current through fixed resistance $R_C$. Additionally, current $i_{RC}$ satisfies:

$$i_{RC} = VSW/R_C. \quad (4)$$

When voltage VSW is measured with the lower switch closed, then solving Equations 3 and 4 yields:

$$R_{thev} = R_C \cdot [(V_{CH1}/V_{CH2-LOW}) - 1] \quad (5)$$

Equations 2 and 5 are combined to yield computations for the bus leakage resistances based on the detected (measured) voltages $V_{bat}$, $V_{CH1}$, and $V_{CH2-LOW}$ for the case when the lower sampling switch is used, as follows:

$$R_n = R_C \cdot \frac{V_{bat}}{V_{CH2-LOW}} \cdot \frac{(V_{CH1} - V_{CH2-LOW})}{(V_{bat} - V_{CH1})} \quad \text{(Equation 6)}$$

and $$R_p = R_n \cdot \left(\frac{V_{bat}}{V_{CH1}} - 1\right) \quad \text{(Equation 7)}$$

As seen above, one switch closure could potentially be sufficient to estimate both leakage resistances $R_n$ and $R_p$. However, when one of the leakage resistances approaches infinity, Equation 6 can become undefined. Therefore, it may be desirable to continue to utilize both the upper and lower sampling switches (and their associated computations) to operate under all conditions. Therefore, the case when the upper sampling switch (44 in FIG. 4) is closed may also be examined in the present invention. Using a second chassis voltage $V_{CH2-HIGH}$ measured with the upper switch being closed produces values for the bus leakage resistances as follows:

$$R_p = R_C \cdot \frac{V_{bat}}{V_{CH1}} \cdot \frac{(V_{CH2-HIGH} - V_{CH1})}{(V_{bat} - V_{CH2-HIGH})} \quad \text{(Equation 8)}$$

and $$R_n = R_p \cdot \left(\frac{V_{CH1}}{V_{bat} - V_{CH1}}\right) \quad \text{(Equation 9)}$$

In one preferred embodiment, the lower sampling switch is closed to detect a value of $V_{CH2-LOW}$ to be used in Equation 6 and the upper sampling switch is closed to detect a value of $V_{CH2-HIGH}$ to be used in Equation 8 (with the value for $V_{CH1}$ being detected just once with both switches open).

Figure 8:
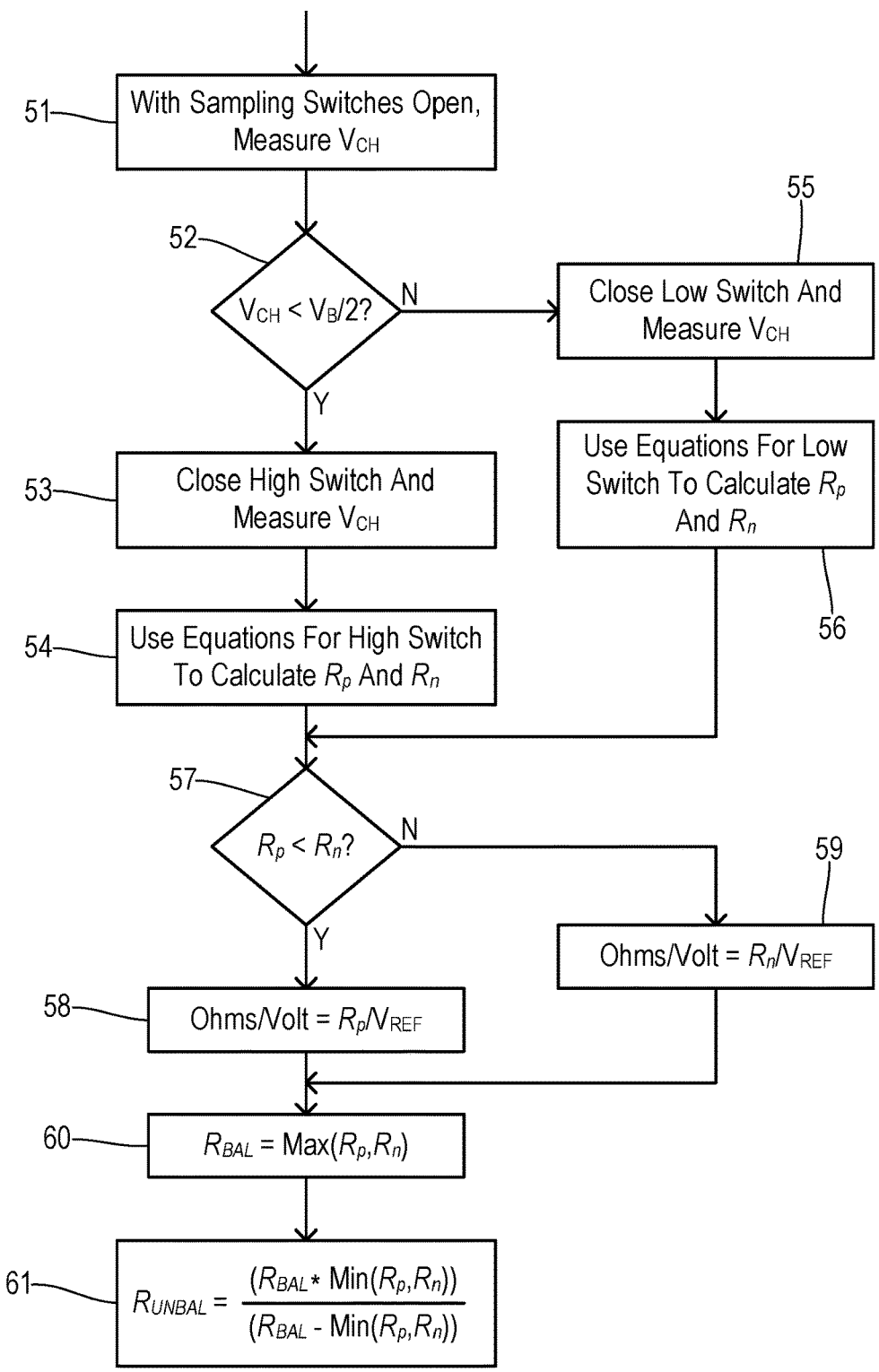
FIG. 8 is a flowchart showing one preferred embodiment of the invention.

In another embodiment, either Equations 6 and 7 are used or Equations 8 and 9 are used depending upon a determination of which leakage resistance is smaller (i.e., farther away from infinity). This alternative method is shown in FIG. 8, wherein the first chassis voltage $V_{CH1}$ is measured in step 51 with the sampling switches open. In step 52, a check is performed to determine whether the measured first chassis voltage $V_{CH1}$ is less than one-half of a battery voltage $V_B$ (i.e., whether bus leakage resistances result in the chassis ground being closer to the positive or the negative bus voltage). If yes, then the upper sampling switch is closed and the second chassis voltage $V_{CH2-HIGH}$ is measured in step 53. In step 54, bus leakage resistances are calculated using Equations 8 and 9. If first chassis voltage $V_{CH1}$ is greater than or equal to one-half of battery voltage $V_B$ then the lower sampling switch is closed and the second chassis voltage $V_{CH2-LOW}$ is measured in step 55. In step 56, bus leakage resistances are calculated using Equations 6 and 7.

Based on the calculated leakage resistances, a bus having a lower isolation is used to calculate an isolation value. Thus, the smaller of the calculated leakage resistances is selected in step 57. The selected smaller leakage resistance is divided by a predetermined voltage in order to calculate the isolation value. The predetermined voltage can be comprised of the measured voltage ($V_B$) of the DC source or a predetermined constant voltage (e.g., the nominal system voltage or a value specified by regulations). The isolation value can be calculated as follows:

$$\frac{\text{Min}(R_p, R_n)}{V_B} \quad \text{(Eq. 10)}$$

wherein $V_B$ may be the measured battery voltage or a predetermined value such as 500V. More specifically, a check is performed in step 57 to determine whether positive bus leakage resistance $R_p$ is less than negative bus leakage resistance $R_n$. If so, then $R_p$ is used to calculate the isolation value in step 58. Otherwise, $R_n$ is used to calculate the isolation value in step 59. The resulting isolation value is compared with an isolation threshold (e.g., 500 ohms/volt), and if it is less than the threshold then the invention generates a warning signal in step 58 or 59 that an atypical condition has been detected. The signaling may be comprised of informing a driver of the condition and/or automatically disconnecting the DC power source from the power buses (e.g., opening the contactor switches).

The calculated values for leakage resistances $R_p$ and $R_n$ can further be used to separate the balanced and unbalanced components of the resistances so that the components can be monitored over time in order to detect or predict certain potential failures in the electrical system. Examples of balanced leakage resistances that can change over time in a manner that identifies an impending fault include a) insulation breakdowns, and b) loss of effectiveness of a cooling-water deionizer in a fuel cell system. A plurality of leakage resistance measurements over time can be separated into balanced/unbalanced components and stored in a database. Both the magnitude and slope within the stored data (e.g., either the balanced or unbalanced components) is used to predict potential failures. Examples of unbalanced leakage resistances that may change over time include contact of battery terminals to chassis, wire contact to the chassis, and other forms of contact.

The calculated values for leakage resistances $R_p$ and $R_n$ can be separated as follows. The larger one of leakage resistances $R_p$ and $R_n$ will correspond to the balanced resistance, i.e., $R_{bal}=\max(R_p, R_n)$. This is because, by definition, the value of $R_{bal}$ must be the same from chassis ground to both the positive and negative buses. An unbalance resistance exists in parallel with the value of $R_{bal}$, from either the positive or negative bus to ground. Since parallel resistances always result in a total resistance lower that each of the parallel resistances, the maximum of $R_p$ and $R_n$ corresponds to the balanced resistance. Therefore, in step 60, the value of $R_{bal}$ is selected as the maximum of the bus leakage voltages.

The unbalanced resistance component can be calculated using $R_p$ and $R_n$ in step 61 as follows:

$$R_{unbal} = \frac{(R_{bal} \cdot \mathrm{Min}(R_p, R_n))}{(R_{bal} - \mathrm{Min}(R_p, R_n))} \quad \text{(Eq. 11)}$$

Figure 9:
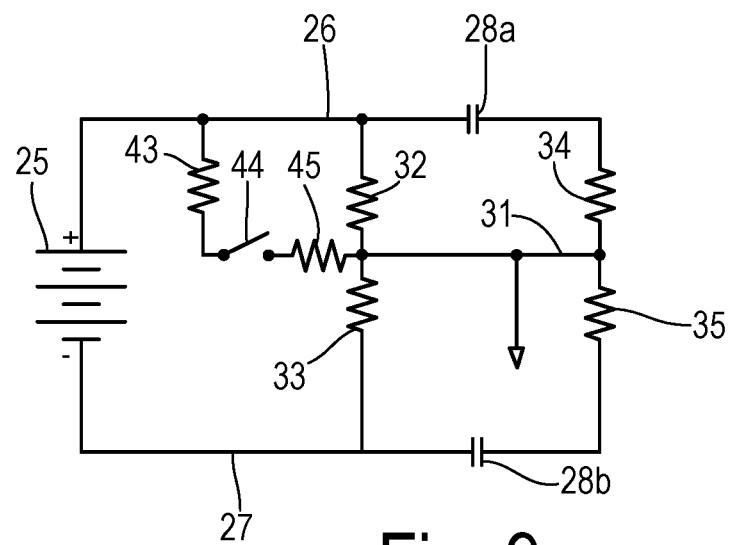
FIG. 9 is a schematic diagram showing leakage resistances and a testing circuit in an electric vehicle wherein battery contactor switches are shown between the balanced and unbalanced leakage resistances.

Components of the bus leakage resistances $R_p$ and $R_n$ may exist on one or both sides of battery contactors 28a and 28b as shown in FIG. 9. It would be beneficial to be able to separate the value of these separate components of the resistances. In particular, balanced portions of the leakage resistances on the battery side of the contactors (shown as leakage resistances 34 and 35). First, with the contactors open, leakage resistances $R_{p\text{-}open}$ and $R_{n\text{-}open}$ are obtained as described above. Then with the contactors closed, new values for the leakage resistances $R_{p\text{-}closed}$ and $R_{n\text{-}closed}$ can be obtained. The values of the battery-side balanced leakage resistances kb and $R_{nb}$ can then be calculated as follows:

$$R_{pb} = \frac{(R_{p\text{-}closed} \cdot R_{p\text{-}open})}{(R_{p\text{-}open} - R_{p\text{-}closed})} \quad \text{(Equation 12)}$$

and $$R_{nb} = \frac{(R_{n\text{-}closed} \cdot R_{n\text{-}open})}{(R_{n\text{-}open} - R_{n\text{-}closed})}. \quad \text{(Equation 13)}$$

What is claimed is:

1. A bus leakage estimation method in an electrified vehicle with a battery, first DC bus, second DC bus, and a chassis, comprising:
   measuring battery voltage and a first chassis Thévenin voltage with respect to the battery;
   coupling a test resistance between the first DC bus and the chassis and measuring a second chassis Thévenin voltage;
   estimating a first bus leakage resistance in response to the Thévenin voltages and the battery voltage without a current measurement.

2. The method of claim 1 further comprising the steps of:
   estimating a second bus leakage resistance of the second DC bus in response to the estimated first bus leakage resistance, the first chassis Thévenin voltage, and the battery voltage.

3. The method of claim 1 wherein the first DC bus is a negative bus, and wherein a bus leakage resistance $R_n$ of the negative bus is estimated according to a formula:

$$R_n = R_C \cdot \frac{V_{bat}}{V_{CH2}} \cdot \frac{(V_{CH1} - V_{CH2})}{(V_{bat} - V_{CH1})}$$

wherein $R_C$ is the test resistance, $V_{bat}$ is the battery voltage, $V_{CH1}$ is the first chassis Thévenin voltage, and $V_{CH2}$ is the second chassis Thévenin voltage.

4. The method of claim 1 wherein the first DC bus is a positive bus, and wherein a leakage resistance $R_p$ of the positive bus is estimated according to a formula:

$$R_p = R_C \cdot \frac{V_{bat}}{V_{CH1}} \cdot \frac{(V_{CH2} - V_{CH1})}{(V_{bat} - V_{CH2})}$$

wherein $R_C$ is the test resistance, $V_{bat}$ is the battery voltage, $V_{CH1}$ is the first chassis Thévenin voltage, and $V_{CH2}$ is the second chassis Thévenin voltage.

* * * * *